United States Patent
Colombo et al.

[11] Patent Number: 6,030,458
[45] Date of Patent: Feb. 29, 2000

[54] PHOSPHORUS EFFUSION SOURCE

[75] Inventors: Paul E. Colombo, White Bear Lake; Scott Priddy, St. Louis Park, both of Minn.

[73] Assignee: Chorus Corporation, White Bear Lake, Minn.

[21] Appl. No.: 08/887,554

[22] Filed: Jul. 3, 1997

Related U.S. Application Data

[63] Continuation of application No. 08/800,605, Feb. 14, 1997, abandoned.

[51] Int. Cl.[7] .................................................. C23C 14/00
[52] U.S. Cl. ............................................ 118/719; 118/726
[58] Field of Search ..................................... 118/719, 726

[56] References Cited

U.S. PATENT DOCUMENTS

| | | |
|---|---|---|
| 4,509,066 | 4/1985 | Schachter et al. . |
| 4,591,408 | 5/1986 | Michel et al. . |
| 4,613,485 | 9/1986 | Parry et al. . |
| 4,618,345 | 10/1986 | Kuck et al. . |
| 4,710,638 | 12/1987 | Wood . |
| 5,041,719 | 8/1991 | Harris et al. . |
| 5,080,870 | 1/1992 | Streetman et al. . |
| 5,144,146 | 9/1992 | Wekhof . |
| 5,156,815 | 10/1992 | Streetman et al. . |
| 5,298,759 | 3/1994 | Brewer et al. . |
| 5,321,260 | 6/1994 | Goldstein et al. . |
| 5,431,735 | 7/1995 | Briones ................................. 118/725 |

FOREIGN PATENT DOCUMENTS

| | | |
|---|---|---|
| 0 132 322 A2 | 1/1985 | European Pat. Off. . |
| 0 154 072 A2 | 9/1985 | European Pat. Off. . |
| 2274468 | 7/1994 | United Kingdom . |
| 2291602A | 1/1996 | United Kingdom . |

OTHER PUBLICATIONS

Copy of International Search Report for counterpart International Application No. PCT/US98/02783.

*Primary Examiner*—Richard Bueker
*Attorney, Agent, or Firm*—Merchant & Gould P.C.

[57] ABSTRACT

This invention is a sublimating and cracking apparatus for producing a beam of molecules to be deposited on a substrate, and an apparatus which is particularly useful with phosphorus as the source material. In the phosphorus effusion cell of this invention, a vacuum jacket encloses and supports a red phosphorus crucible, a condensing crucible for white phosphorus and a connecting tube within a vacuum space. In use, red phosphorus is first transformed and deposited as white phosphorus in the condensing chamber. The white phosphorus is then directed to a cracker section where it is cracked and subsequently directed to the substrate.

10 Claims, 5 Drawing Sheets

PHOSPHORUS EFFUSION SOURCE

This is a Continuation of application Ser. No. 08/800,605, filed Feb. 14, 1997, now abandoned.

BACKGROUND OF THE INVENTION

This invention relates to a sublimating and cracking apparatus for producing a beam of molecules to be deposited on a substrate, and more specifically to such an apparatus which is particularly useful with phosphorus as the source material.

In molecular beam epitaxy (MBE), molecular beams of certain elements, such as pure phosphorus, are directed onto the surface of a substrate, where they react with each other to create a layer with the desired properties. These layers are used to construct complex semiconducting structures.

Cracking effusion devices first sublimate solid source material and then "crack" it, that is, convert the vaporous material to smaller atomic species by subjecting it to extremely high temperatures. Thus, for example, a phosphorus cracker generally has a crucible for sublimating solid phosphorus, a cracker to convert the vaporous $P_4$ phosphorus into vaporous $P_2$ phosphorus, and a valve to control the flow of $P_4$ phosphorus into the cracker.

Phosphorus effusion devices are constructed using either a one or two chamber design. In a single chamber design, solid red phosphorus is sublimated at about 300° C. in a furnace or crucible, which is vacuum evacuated. When the red phosphorus is sublimated, it produces both red phosphorus vapor and white phosphorus vapor, which is then introduced to the phosphorus cracker by a valve before being directed to the substrate.

Such a single chamber design suffers from at least one drawback. In particular, some of the vaporous white phosphorus condenses on the walls of the chamber. At an operating temperature of 300° C., the vapor pressure of white phosphorus is significantly higher than that of red phosphorus. As a result, when the valve is closed, a large pressure build-up occurs in the chamber. When the valve is then opened to the cracker, pressure bursts occur into the MBE chamber. The excess release of phosphorus into the MBE chamber is harmful to the MBE growth system. In addition, the MBE chamber requires several hours after such a pressure burst to recover to a proper working pressure.

To reduce this problem, it has been proposed to add a second chamber to the system design. The vaporous white phosphorus is purposefully condensed in a second chamber so that it deposits on the walls of the second chamber. This second chamber is independently thermostated so that the walls are cooler to encourage the white phosphorus condensation, which significantly reduces the vapor pressure within the second chamber. A valve admits the vaporous phosphorus to the cracker where $P_4$ phosphorus is converted to $P_2$ phosphorus.

U.S. Pat. No. 5,431,735, issued Jul. 11, 1995 to Briones, describes a phosphorus effusion cell which uses two chambers. In all but one of the embodiments shown in the Briones patent, the condensing chamber is located downstream of the sublimation chamber and upstream of the cracker, such that the phosphorus flows continuously from the sublimation chamber, through the condensation chamber, and to the cracker. In one embodiment, shown in FIG. 9 of the Briones patent, the condensing chamber is not shown to be downstream of the sublimation chamber, but rather is disposed in a "side-by-side" relationship at opposite ends of a separator tube, with a cracking tube leading to the cracker connected to the midpoint of the separator tube. While the Briones patent suggests that such an arrangement can still provide a continuous flow of phosphorus vapor without pressure build-up problems, it is unclear whether this is, in fact, the case.

In addition, other problems remain with existing two chamber phosphorus effusion cells. Although the second chamber may be vacuum evacuated, it is surrounded by air at atmospheric pressure. This pressure difference causes atmospheric gases, such as $O_2$, $N_2$, and Ar, to leak or diffuse into the lower pressure chambers containing the red and white phosphorus. This leakage allows contaminants to get into the phosphorus flux when the valve is opened to deposit phosphorus.

Solid-source valved cracker sources have previously used a conventional cracking tube that consists of a high temperature resistant tube (tantalum, tungsten, PBN, graphite, molybdenum) that was heated from an exterior heater. The cracking of the molecules is accomplished by heating the exterior of the tube to a high temperature so that the interior surface of the tube is hot enough to thermally decompose or crack the molecules into smaller species. This device uses more energy than is necessary to crack the molecules, because the heating filaments supply heat to the molecules only indirectly. As a result, the heat shielding and exterior filament are larger than necessary. Also, if a baffle assembly is inserted into the tube it is blocked from direct radiation from the hot filament by the tube. Therefore, a catalytic baffle used to reduce the temperature needed to crack the molecule is not getting as hot as the tube in crackers of this design. Therefore, this design wastes energy. Also, adding unnecessary energy, or heat, causes contaminants to be released into the vacuum growth environment. A source capable of operating with less heat-released contamination is desired.

SUMMARY OF THE INVENTION

The invention is a phosphorus effusion cell, for providing a pure phosphorus vapor from solid phosphorus, where a vacuum jacket encloses and supports an inner compartment containing a red phosphorus crucible, a condensing crucible for white phosphorus and a connecting tube within a vacuum, where the vacuum is capable of high to ultrahigh vacuum pressures. The red phosphorus crucible sublimates solid phosphorus into vaporous phosphorus, which moves through the connecting tube to the condensing crucible. Vaporous white phosphorus condenses on the walls of the condensing crucible, which is axially aligned with the red phosphorus crucible. A valve, located between the connecting tube and the cracking tube, is used to admit the phosphorus vapor to a cracking tube. A cracking tube is used to crack $P_4$ phosphorus in the phosphorus vapor to $P_2$ phosphorus. The cracking tube is provided with a more efficient design by using an internal heating filament.

The phosphorus effusion cell is preferably operated by first heating the red phosphorus in the red phosphorus crucible with valve in the closed position, causing all or substantially all of the red phosphorus to flow to the condensing crucible and condense in the form of white phosphorus. The heater for the red phosphorus crucible can then be turned down or off, and the valve opened, causing phosphorus vapor from the condensing crucible to flow to the cracker.

Because of the vacuum jacket surrounding the sublimation and condensing chamber, the problem of contaminants flowing into the phosphorus vapor stream is eliminated. To the extent leakage occurs from the chambers, the leakage flows out of the chambers into the area defined by the vacuum jacket, rather than vice versa.

Also, because the crucible is isolated within a vacuum environment, it is possible to bake out, or outgas, the phosphorus crucible to very high temperatures, unattainable in previous phosphorus effusion cells.

In a preferred embodiment of the invention, the ultrahigh vacuum which surrounds the red phosphorus crucible, the condensing crucible, and the connecting tube is provided by the system the source is mounted on. In such instances, if there is a small leak from atmospheric pressure into the system, it is pumped away by the system and does not contaminate the phosphorus crucible.

Also in the preferred embodiment, the heater filament in the cracker section is located within the cracking tube, which allows for better heat transfer to the phosphorus molecules. As a result, the heater filaments can be operated at lower temperatures, improving efficiency and reducing contamination to the MBE system.

DETAILED DESCRIPTION OF THE DRAWINGS

Figure 1:
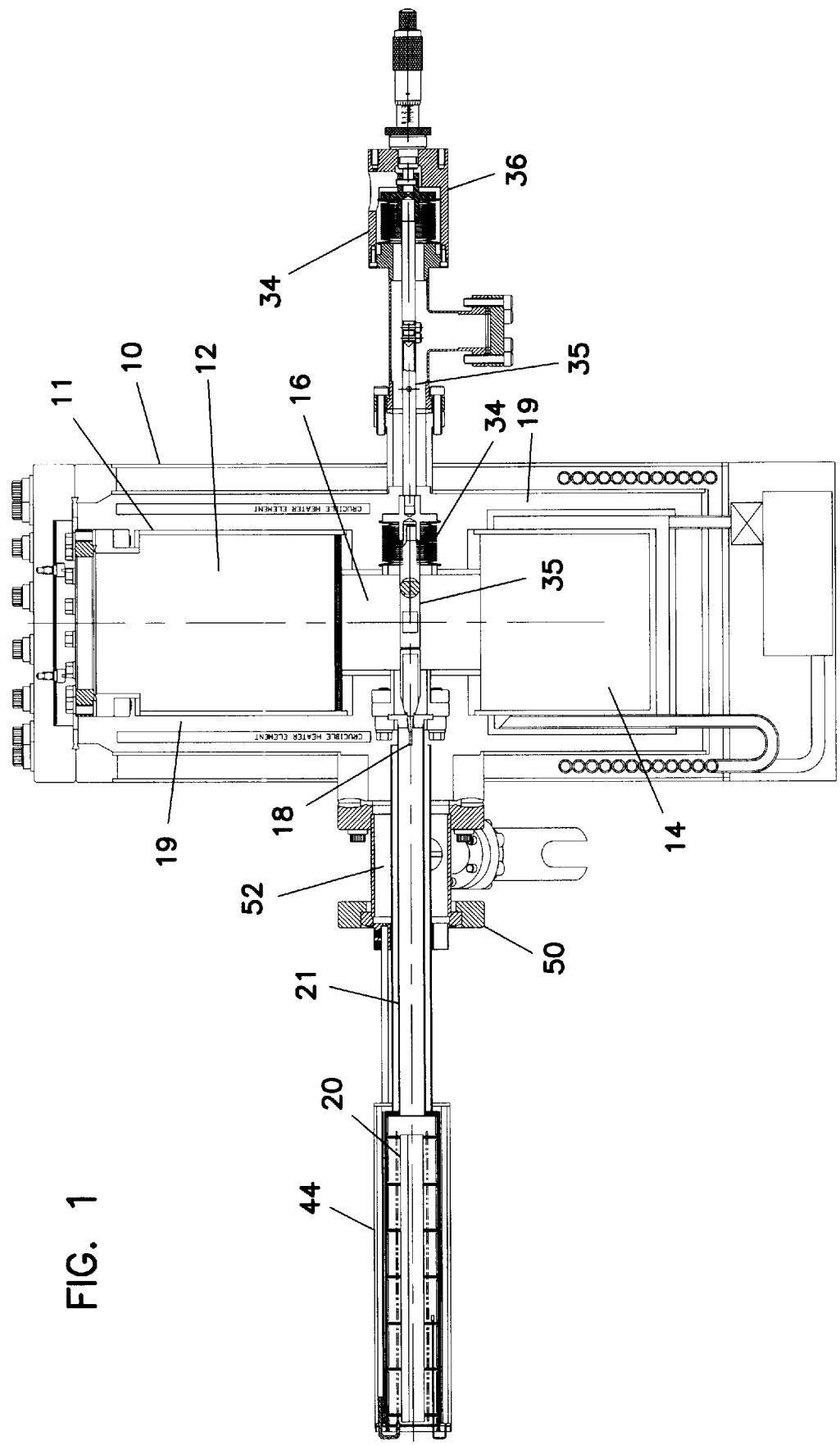
FIG. 1 is a cross-sectional view of the side of a preferred embodiment of a phosphorus effusion cell made according to the present invention.

A preferred embodiment of a phosphorus effusion cell is shown in FIGS. 1–5. Referring to FIG. 1, the components of a preferred embodiment include a vacuum jacket 10 which encloses an inner compartment 11 containing two crucibles, a red phosphorus sublimation crucible 12 and a condensing crucible 14. These two crucibles are connected by a connecting tube 16. A needle valve 18 leads from the connecting tube 16 to a cracking tube 20. Between the needle valve 18 and the cracking tube 20 is a flow tube 21 which guides the vaporous phosphorus toward the cracking tube 20 where it will be exposed to a high temperature furnace assembly 44.

A linear actuator 36 is preferably located on the opposite side of the needle valve 18 from the cracking tube 20. The linear actuator 36 may include a shaft 35 extending through a passage leading up to the connecting tube 16. The shaft 35 is connected to the needle valve 18. Two vacuum tight bellows 34 are positioned along the linear actuator, to permit linear movement of the actuator shaft without loss of vacuum.

Figure 4:
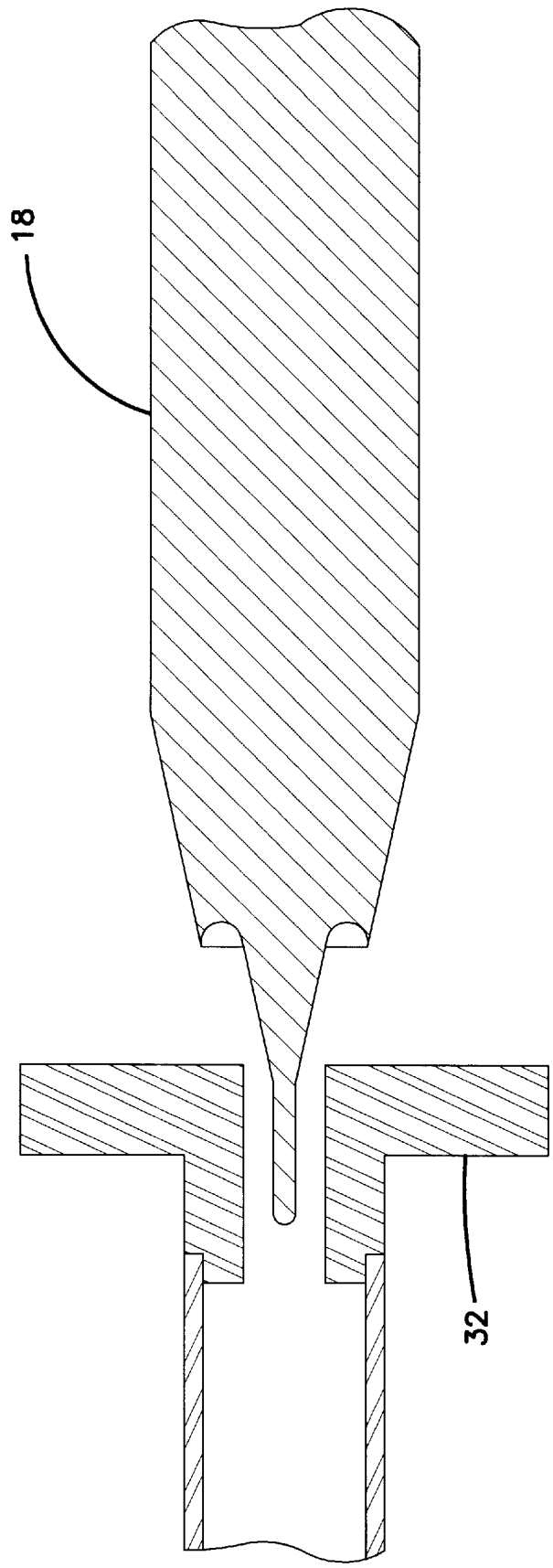
FIG. 4 is an exploded cross-sectional view of a valve component of the phosphorus effusion cell shown in FIG. 1.

As shown in FIG. 4, the needle valve 18 is preferably made up of a long metal component which may include three portions. First, a straight lead is at the head of the needle valve, and will have a cross-section area slightly smaller than the opening in the needle seat. Second, a finely tapered needle valve section follows the straight lead. The positioning of this section in the needle seat will determine the rate at which phosphorus vapor flows into the cracking tube. Third, a knife-edged sealing section tightly seals the valve when it is closed. The linear actuator 36, via the shaft 35, is used to move the needle valve 18 within a needle seat 32.

Vacuum tight compartment 11, which is made up of red phosphorus crucible 12, condensing crucible 14, and connecting tube 16, is placed within the vacuum jacket 10, so as to define a vacuum space 19 between the vacuum jacket and the compartment. The vacuum jacket 10 provides an air tight seal at high to ultra-high vacuum pressures around the inner compartment 11 of this phosphorus effusion cell. A vacuum space 19 will prevent the phosphorus charge within the crucibles from becoming contaminated by atmospheric pressure leaking into the compartment 11.

Figure 3:
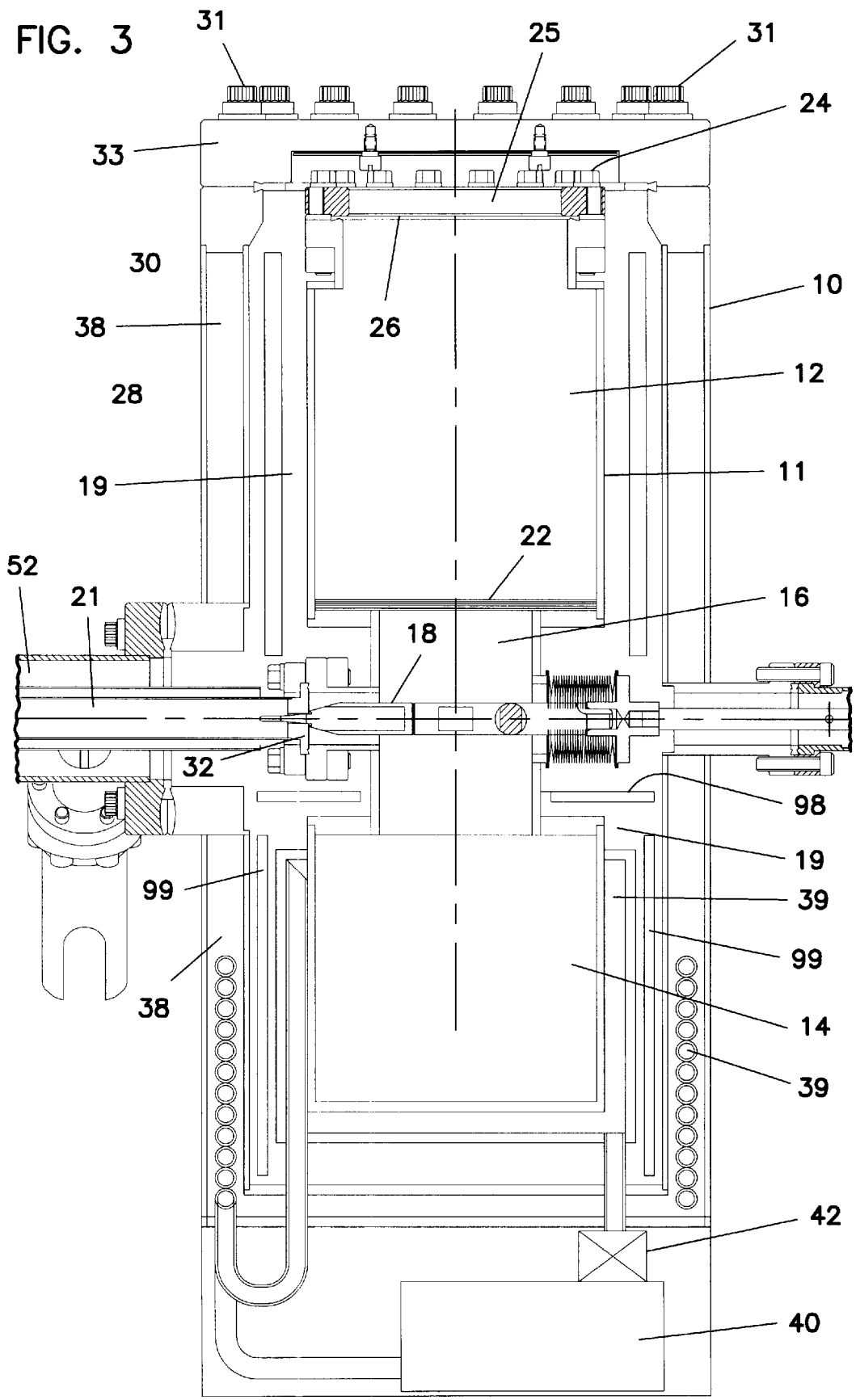
FIG. 3 is an exploded cross-sectional view of the side of the vacuum jacket enclosed portion of the phosphorus effusion cell of FIG. 1.

Now referring to FIG. 3, the vacuum jacket 10 has a main body flange 33, which is sealed onto the top of the vacuum jacket 10 by sealing bolts 31. To ensure that vacuum jacket 10 is kept at high to ultra-high vacuum pressure, a metal gasket 30 is provided on the main body along with sealing bolts 31 to ensure that the top of the vacuum jacket 10 is very securely in place.

Figure 2:
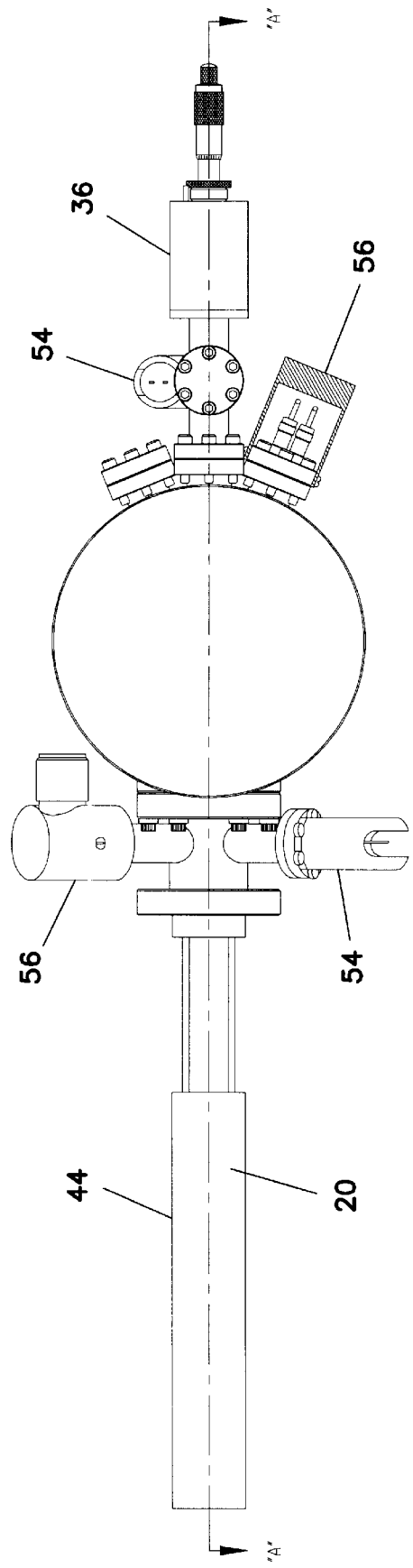
FIG. 2 is a view of the bottom of the phosphorus effusion cell of FIG. 1.

Now referring to FIG. 2, a thermocouple coupling 54 and a power coupling 56 are also shown. These couplings provide necessary connections to temperature monitoring and a power source to components within the phosphorus effusion cell. Such couplings are generally known to persons of skill in the art of the present invention.

Now referring to FIG. 3, it can be seen that the top of the red phosphorus crucible 12 is sealed with a lid 25, a metal gasket 26 and several crucible sealing bolts 24. A heating assembly 28 surrounds the crucible 12. Both heating assemblies 28 and 44 are preferably of the open filament type, made from tantalum wire.

The red phosphorus crucible 12 is open to the connecting tube 16 and the condensing crucible 14 except for the intervention of a red phosphorus containment screen 22. The red phosphorus containment screen 22 allows vapor to pass through, while retaining particulate phosphorus.

In a preferred embodiment, the effusion cell has a fluid cooling system 38 extending throughout the walls of the vacuum jacket 10 so as to cool the walls of the vacuum jacket. In addition, cooling tubes 39 also extend through the walls of the condensing crucible 14 and allows for controlled cooling of the walls. Both the cooling tubes 39 and the cooling system 38 may be supplied with cooled fluid by a fluid pump 40, or another circulation device. A control valve 42 monitors the temperature and flow of the fluid. The cooling fluid may be water or air, and different cooling fluids could be provided for the cooling system 38 and the cooling tubes 39.

Now referring to FIG. 1, the effusion cell has a mounting flange 50 for connecting the effusion cell to a MBE vacuum chamber (not shown). A passage 52 connects the vacuum space to the vacuum chamber. Thus, it can be seen that if a pressure difference caused a leak or diffusion of atmospheric gases through the vacuum jacket 10, these atmospheric gases would be immediately pumped away by the main pump (not shown) of the MBE system through vacuum space 19 and passage 52.

While atmospheric pressure is about 760 torr, the pressure within the inner compartment 11 is slightly greater than $1 \times 10^{-2}$ torr. The vacuum space 19 is maintained at less than $1 \times 10^{-6}$ torr. Because the inner compartment 11 is surrounded by a lower pressure zone, the problem of contaminants flowing into the phosphorus vapor stream is eliminated. To the extent leakage occurs from the chambers, the leakage flows out of the chambers into the area defined by the vacuum jacket, rather than vice versa.

Another advantage of the vacuum jacket 10 is that it is possible to bake out or outgas the entire crucible assembly to higher temperatures, greater than 650° C., allowing better cleaning of the contaminants in the crucible. Previous sources had an upper limit for the entire assembly of 200° C. While previous sources could bake the parts of the interior that were contained within the vacuum walls to up to 600° C., this did not include the vacuum walls.

It is important to prevent condensation of white phosphorus on the bellows 34. In previous phosphorus effusion cells, the bellows were located on the low pressure side of the needle valve and a heater was maintained around the bellows area to keep condensation to a minimum. In the present invention, however, the bellows 34 are at a high pressure compared to the needle valve 18. In order to ensure that no white phosphorus condenses on the bellows 34, extra heating wire may be designed into this area. After initial testing with each apparatus, a temperature condition can be put on the bellows 34.

Now referring to FIG. 3, the heater filament 28 A.surrounding the red phosphorus crucible 12 preferably does not extend over the complete length of the interior of the source. The heater filament may extend from the top of the source to past the bellows 34. The white phosphorus condensing area 14 has an independent heating filament 99 around it. In addition, there is heat shielding 98 between the two zones so they can be controlled independently. If no cooling mechanism were activated in the white phosphorus condensing area 14, the whole apparatus would get hot when the heater filaments were activated. With heat shielding and cooling activated to the white phosphorus condensing area, a differential of 400° C. can be maintained during conversion of red phosphorus to white phosphorus.

Figure 5:
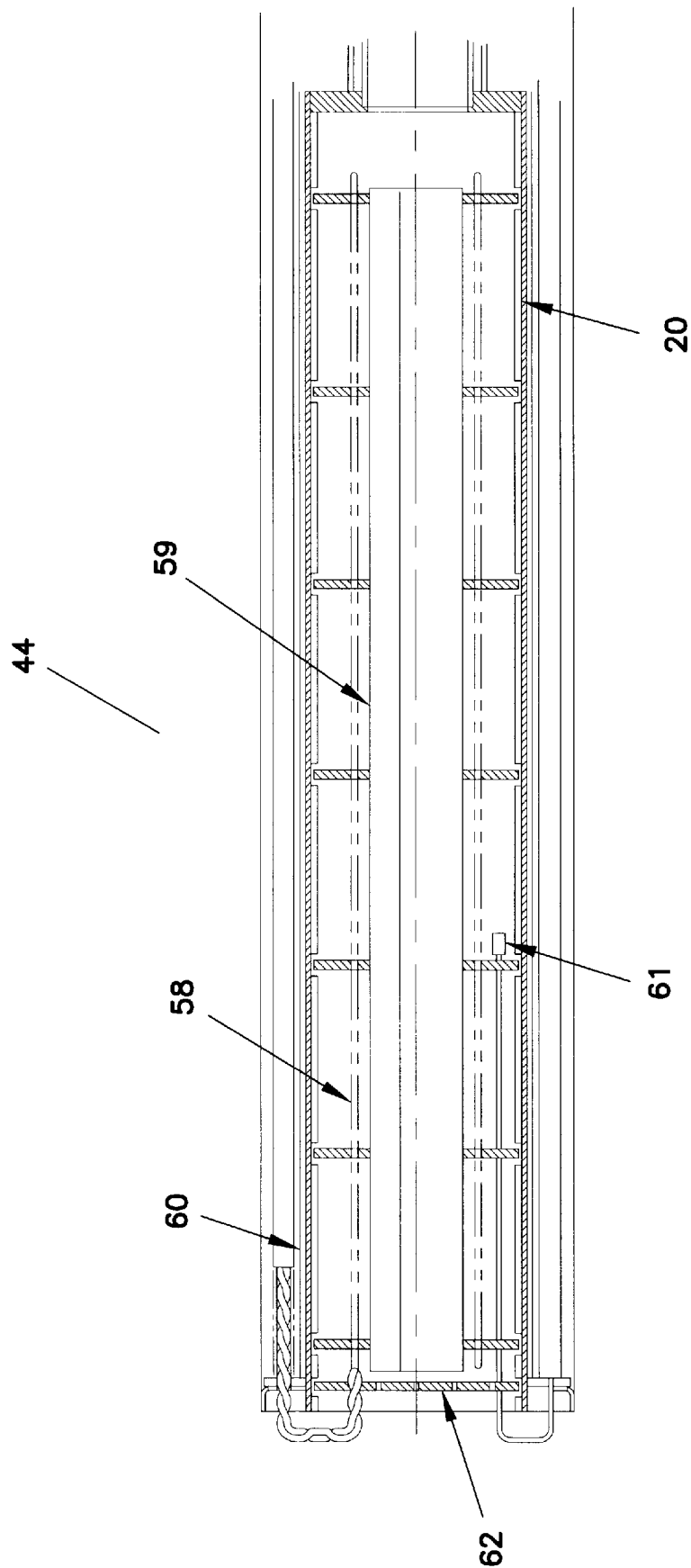
FIG. 5 is an exploded cross-sectional view of the cracking tube shown in FIG. 1.

Now referring to FIG. 5, the phosphorous cracker 20 is shown in greater detail. Typical crackers consist of a heat resistant tube which is heated by an exterior heater. However, for phosphorous, it is possible to invert the filament position. The $P_4$ molecule that is cracked into a $P_2$ molecule does not react with the elements used in the cracking tube assembly. Therefore, the cracker can be safely made with a filament 58 inside the cracking tube 20. The filament is preferable made of tantalum wire would in a serpentine manner and supported by spacer disks made of pyrolytic boron nitride (PBN). An external heat shield 60, a thermocouple 61, and a diffuser plate 62 are also provided in the cracking tube 20. A cylindrical baffle 59 extends lengthwise within the filament.

The cracker structure shown in FIG. 5 results in several advantages. The $P_4$ molecule can directly hit the hot filament 58 for more efficient conversion to $P_2$. Also, in a preferred embodiment, heat energy radiated from the filament hits cracking baffle 59 directly without having any intervening heat shield barriers. The cracking baffle is used to increase the hot surface area available for collisions with $P_4$ molecules. In addition, the inner surface of the cracking tube 20 is now directly radiated by the hot filament. This cracking tube arrangement provides the most efficient use of energy to crack $P_4$. This allows minimal energy to be used to crack the $P_4$, reduces thermal pollution to the vacuum environment, and lowers background levels of contamination, thus creating the highest purity flux and subsequently purest MBE material.

Now referring to FIG. 2, in order to produce the pure phosphorus vapor required for molecular beam epitaxy and other applications, certain procedures should be followed. At the factory, an initial outgassing should be carried out without the lid 25 or the red phosphorus containment screen 22 in place. The needle valve 18 is preferably opened, and water is not allowed to flow through the cooling system 38 and cooling jacket 39 so the cooling mechanism is off. The heating filament 28 may be heated to 300° C. in order to outgas the heat shielding and the body. The cracking tube is preferably at 600° C. during this procedure.

A second high temperature outgassing should be carried out to bring the source up to its maximum temperature. Basically, the same setup is used as was used during the first outgassing, except the red phosphorus screen 22 is in place, and water is allowed to flow through cooling system 38. The cracking tube 20 is heated to 900° and the inner compartment 11 is heated to 650° C. Subsequently the cracking tube temperature is increased to 1600° C. and the source may be left to soak overnight.

Solid phosphorus can then be placed within the red phosphorus crucible 12. First the system is vented. Then main body flange 33 is removed, lid 25 is removed and red phosphorus chunks are added to the red phosphorus crucible 12. Then, the metal gasket 26 and the lid 25 are installed on top of the red phosphorus crucible 12 and the crucible sealing bolts 24 are tightened. The main body flange 33 is then installed. The cracking tube 20 is then brought to an appropriate cracking temperature.

To clean or purify a red phosphorus charge, the phosphorus charge is heated to 100° C. with the needle valve 18 open and the cracking zone at cracking temperature. After an initial outgassing at 100° C., the needle valve 18 should then be closed. The phosphorus charge within the red phosphorus crucible 12 is now heated to between 300–450° C. The needle valve 18 is then opened and the contaminants are vented out of the phosphorus source. This venting process may need to be repeated a number of times. The source is then cooled.

In order to convert red phosphorus to white phosphorus, the condensing crucible 14 is started in the cooling process. The condensing crucible 14 is cooled by the fluid cooling tubes 39. The needle valve 18 is closed. Once the condensing crucible has begun cooling, the red phosphorus crucible is heated to 450° C. The red phosphorus is allowed to convert inside the red phosphorus crucible 12 for several hours. The assembly is allowed to cool down to an appropriate growth temperature.

In order to use the phosphorus valve cracker 20, the cracking head is heated to cracking temperatures. Meanwhile, the condensing crucible 14 continues to cool. The main heater is run to approximately 150° C. in the red phosphorus crucible zone. To re-evaporate the condensed white phosphorus, the cooling to the condensing crucible 14 is decreased, while the heating of the red phosphorus crucible 12 is increased. The action of heating filaments 28 will sufficiently heat the white phosphorus condensing area to cause re-evaporation. The position of the needle valve 18 may be determined through experimentation with each apparatus to find the proper position to modulate the flux.

The precise temperatures and time lengths of these procedures will need to be determined by the end user through experimentation with a particular device, and depending on the peculiarities of the source material.

The above specification, examples and data provide a complete description of the use of the invention. Since many embodiments of the invention can be made without departing from the spirit and scope of the invention, the invention resides in the claims hereinafter appended.

What is claimed:

1. A phosphorus effusion cell adapted to be mounted to a vacuum chamber, for providing a phosphorus vapor from solid phosphorus, comprising:

a sealed compartment, said sealed compartment comprising a red phosphorus crucible which holds the solid phosphorus, a condensing crucible which is axially aligned with the red phosphorus crucible, and a connecting tube which extends between the red phosphorus crucible and the condensing crucible;

a heater located adjacent the red phosphorus crucible which heats the red phosphorus crucible;

a cracking tube to crack $P_4$ phosphorus in the phosphorus vapor to $P_2$ phosphorus;

a flow tube extending from the connecting tube to the cracking tube;

a valve, located within the flow tube, which controls flow of the phosphorus vapor from the sealed compartment to the cracking tube; and a vacuum jacket which encloses and supports the sealed compartment, wherein a vacuum space is defined between the vacuum jacket and the sealed compartment, the vacuum space being externally pumped so as to reduce the pressure in the vacuum space.

2. The phosphorus effusion cell of claim 1, the sealed compartment further comprising an opening adjacent to the red phosphorus crucible, a lid which is designed to cover the opening, a metal gasket which is designed to seal the crucible, and sealing bolts for securing the lid over the opening.

3. The phosphorus effusion cell of claim 1 further comprising:

a cooling jacket, surrounding the condensing crucible, which is filled with cooling fluid, the cooling fluid being circulated by a circulating device.

4. The phosphorus effusion cell of claim 1 further comprising:

a main body cooling jacket located adjacent the condensing crucible and the red phosphorus crucible, wherein the main body cooling jacket is filled with cooling fluid, the cooling fluid being circulated by a circulating device.

5. The phosphorus effusion cell of claim 1 wherein the valve is a needle valve, comprising a needle shaft and a needle seat, the needle seat receiving the needle shaft, the needle valve being capable of a closed position where the needle shaft is tightly positioned within the needle seat.

6. The phosphorus effusion cell of claim 1 further comprising:

a linear actuator, connected to the valve, for moving the valve between an open position and a closed position.

7. The phosphorus effusion cell of claim 1 wherein the vacuum jacket further comprises:

an opening to the vacuum jacket, a main body lid which fits over the opening to the vacuum jacket, a gasket which is placed between the main body lid and the vacuum jacket, and sealing bolts used to seal the main body lid and gasket over the opening.

8. The phosphorus effusion cell of claim 1 wherein the cracking tube further comprises:

a heat resistant tube, having an interior surface and defining an interior space;

a filament located within the interior space of the heat resistant tube; and a heat shield surrounding the heat resistant tube.

9. The phosphorus effusion cell of claim 8, wherein the cracking tube further comprises:

a central axis; and a baffle located in the interior space and located closer to the central axis than the filament.

10. The phosphorus effusion cell of claim 1, wherein the vacuum space is in open communication with the vacuum chamber.

* * * * *